(12) United States Patent
Kim et al.

(10) Patent No.: US 10,978,677 B2
(45) Date of Patent: Apr. 13, 2021

(54) ORGANIC LIGHT EMITTING DISPLAY DEVICE

(71) Applicant: SAMSUNG DISPLAY CO., LTD., Yongin-si (KR)

(72) Inventors: Suk Kim, Hwaseong-si (KR); Geebum Kim, Hwaseong-si (KR); Sungkook Park, Suwon-si (KR); Jinwoo Lee, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 3 days.

(21) Appl. No.: 16/601,715

(22) Filed: Oct. 15, 2019

(65) Prior Publication Data

US 2020/0194727 A1    Jun. 18, 2020

(30) Foreign Application Priority Data

Dec. 17, 2018 (KR) ........................ 10-2018-0163489

(51) Int. Cl.
*H01L 51/52* (2006.01)
*H01L 27/32* (2006.01)

(52) U.S. Cl.
CPC ...... *H01L 51/5275* (2013.01); *H01L 27/3246* (2013.01); *H01L 51/5268* (2013.01); *H01L 27/322* (2013.01); *H01L 27/3211* (2013.01)

(58) Field of Classification Search
CPC ............. H01L 51/5275; H01L 51/5268; H01L 27/3246; H01L 27/322
See application file for complete search history.

(56) References Cited

U.S. PATENT DOCUMENTS

| 8,098,348 | B2 | 1/2012 | Lee et al. | |
| 2006/0103779 | A1 | 5/2006 | Amemiya et al. | |
| 2007/0194307 | A1* | 8/2007 | Kim | H01L 51/5221 |
| | | | | 257/40 |
| 2018/0006264 | A1* | 1/2018 | Lee | H01L 27/3246 |
| 2018/0149872 | A1 | 5/2018 | Choi et al. | |
| 2020/0091247 | A1* | 3/2020 | Lee | H01L 51/0097 |

FOREIGN PATENT DOCUMENTS

| JP | 2006171700 A | 6/2006 |
| JP | 2009272068 A | 11/2009 |
| KR | 1020100073228 A | 7/2010 |
| KR | 101318253 B1 | 10/2013 |
| KR | 1020180061467 A | 6/2018 |

\* cited by examiner

*Primary Examiner* — Thomas L Dickey
(74) *Attorney, Agent, or Firm* — Cantor Colburn LLP

(57) ABSTRACT

An organic light emitting display device includes a substrate, first electrodes disposed on the substrate, a pixel defining layer disposed on the substrate and exposing at least a part of the first electrodes, a second electrode disposed on the first electrodes and the pixel defining layer, an organic light emitting layer disposed between the first electrodes and the second electrode, a thin film encapsulation layer disposed on the second electrode, barrier ribs disposed on the thin film encapsulation layer, the barrier ribs overlapping the pixel defining layer between two adjacent ones of the first electrodes, and a planarization layer disposed on the thin film encapsulation layer and the barrier ribs, and having a refractive index higher than that of the barrier ribs. Each of the barrier ribs has a closed loop shape that encloses one of the two adjacent ones of the first electrodes in a plan view.

20 Claims, 9 Drawing Sheets

ORGANIC LIGHT EMITTING DISPLAY DEVICE

This application claims priority to Korean Patent Application No. 10-2018-0163489, filed on Dec. 17, 2018, and all the benefits accruing therefrom under 35 U.S.C. § 119, the content of which in its entirety is herein incorporated by reference.

1. FIELD

Exemplary embodiments of the invention relate to an organic light emitting diode ("OLED") display device.

2. DISCUSSION OF RELATED ART

Display devices may be classified into various types such as liquid crystal display ("LCD") devices, organic light emitting diode ("OLED") display devices, plasma display panel ("PDP") display devices and electrophoretic display devices based on a light emitting scheme thereof.

In general, the OLED display devices include two electrodes and an organic light emitting layer disposed between the two electrodes. Holes injected from one of the two electrodes and electrons injected from the other of the two electrodes are combined with each other in the organic light emitting layer to form an exciton. When such excitons fall from an excited state to a ground state, an energy is released to emit light.

Such OLED display devices include a plurality of pixels that include OLEDs, which are self-light emitting elements, and a plurality of transistors and at least one capacitor for driving the OLEDs are disposed in each pixel. The plurality of transistors basically include a switching transistor and a driving transistor.

SUMMARY

Light generated in the organic light emitting diode ("OLED") is lost in a considerable amount as it passes through several layers, and transmittance becomes lowered. In order to solve such a problem, attempts have been made to form a lens, for example. However, it is not easy to control the curvature of the lens, and a distance between the lens and the OLED is too long to improve the transmittance.

Exemplary embodiments of the invention may be directed to an OLED display device improved in terms of outgoing light efficiency and frontal visibility.

In an exemplary embodiment, an organic light emitting display device includes a substrate, a plurality of first electrodes disposed on the substrate, a pixel defining layer disposed on the substrate and exposing at least a part of the plurality of first electrodes, a second electrode disposed on the plurality of first electrodes and the pixel defining layer, an organic light emitting layer disposed between the plurality of first electrodes and the second electrode, a thin film encapsulation layer disposed on the second electrode, a plurality of barrier ribs disposed on the thin film encapsulation layer and overlapping the pixel defining layer between two adjacent ones of the plurality of first electrodes, and a planarization layer disposed on the thin film encapsulation layer and the plurality of barrier ribs, and having a refractive index higher than that of the plurality of barrier ribs. Each of the plurality of barrier ribs has a closed loop shape that encloses one of the two adjacent ones of the plurality of first electrodes in a plan view.

In an exemplary embodiment, the plurality of barrier ribs may not overlap the plurality of first electrodes.

In an exemplary embodiment, the organic light emitting display device may further include a scattering layer overlapping the pixel defining layer between the plurality of barrier ribs.

In an exemplary embodiment, the scattering layer may have a thickness less than a thickness of each of the plurality of barrier ribs.

In an exemplary embodiment, the scattering layer may have a thickness in a range from about 1 micrometer ($\mu$m) to about 8 $\mu$m.

In an exemplary embodiment, each of the plurality of barrier ribs may have an isosceles trapezoidal shape in a cross-sectional view.

In an exemplary embodiment, at least a part of the plurality of barrier ribs may each have a non-isosceles trapezoidal shape in a cross-sectional view.

In an exemplary embodiment, the organic light emitting display device may further include a color conversion layer disposed between the thin film encapsulation layer and the planarization layer.

In an exemplary embodiment, the plurality of barrier ribs may be linearly symmetric with respect to an imaginary straight line that passes through a center of the pixel defining layer between the two adjacent ones of the plurality of first electrodes and is perpendicular to the substrate.

In an exemplary embodiment, the organic light emitting display device may include a light emission area which is divided by the pixel defining layer and through which light generated from the organic light emitting layer is emitted. The plurality of barrier ribs may be disposed apart from the light emission area in the plan view.

In an exemplary embodiment, a shortest horizontal distance between the light emission area and one of the plurality of barrier ribs that is disposed adjacent to the light emission area may be in a range from about 0.5 $\mu$m to about 3.0 $\mu$m.

In an exemplary embodiment, each of the plurality of barrier ribs may have a thickness in a range from about 4.0 $\mu$m to about 8.0 $\mu$m.

In another exemplary embodiment, an organic light emitting display device includes a substrate, a plurality of first electrodes disposed on the substrate, a pixel defining layer disposed on the substrate and exposing at least a part of the plurality of first electrodes, a second electrode disposed on the plurality of first electrodes and the pixel defining layer, an organic light emitting layer disposed between the plurality of first electrodes and the second electrode, a thin film encapsulation layer disposed on the second electrode, a plurality of barrier ribs disposed on the thin film encapsulation layer, the plurality of barrier ribs overlapping the pixel defining layer between two adjacent ones of the plurality of first electrodes, a scattering layer overlapping the pixel defining layer between the plurality of barrier ribs, and a planarization layer disposed on the thin film encapsulation layer, the plurality of barrier ribs, and the scattering layer, and having a refractive index higher than that of the plurality of barrier ribs.

In an exemplary embodiment, the scattering layer may have a thickness less than a thickness of each of the plurality of barrier ribs.

In an exemplary embodiment, the scattering layer may have a thickness in a range from about 1 $\mu$m to about 8 $\mu$m.

In an exemplary embodiment, each of the plurality of barrier ribs may have a closed loop shape that encloses one of the two adjacent ones of the plurality of first electrodes in a plan view.

In an exemplary embodiment, the plurality of barrier ribs may be linearly symmetric with respect to an imaginary straight line that passes through a center of the pixel defining layer between the two adjacent ones of the plurality of first electrodes and is perpendicular to the substrate.

In an exemplary embodiment, the plurality of barrier ribs may not overlap the plurality of first electrodes.

In an exemplary embodiment, each of the plurality of barrier ribs may have an isosceles trapezoidal shape in a cross-sectional view.

In an exemplary embodiment, at least a part of the plurality of barrier ribs may each have a non-isosceles trapezoidal shape in a cross-sectional view.

The foregoing is illustrative only and is not intended to be in any way limiting. In addition to the illustrative exemplary embodiments and features described above, further exemplary embodiments and features will become apparent by reference to the drawings and the following detailed description.

BRIEF DESCRIPTION OF THE DRAWINGS

A more complete appreciation of the invention will become more apparent by describing in detail embodiments thereof with reference to the accompanying drawings, in which.

DETAILED DESCRIPTION

Figure 1:
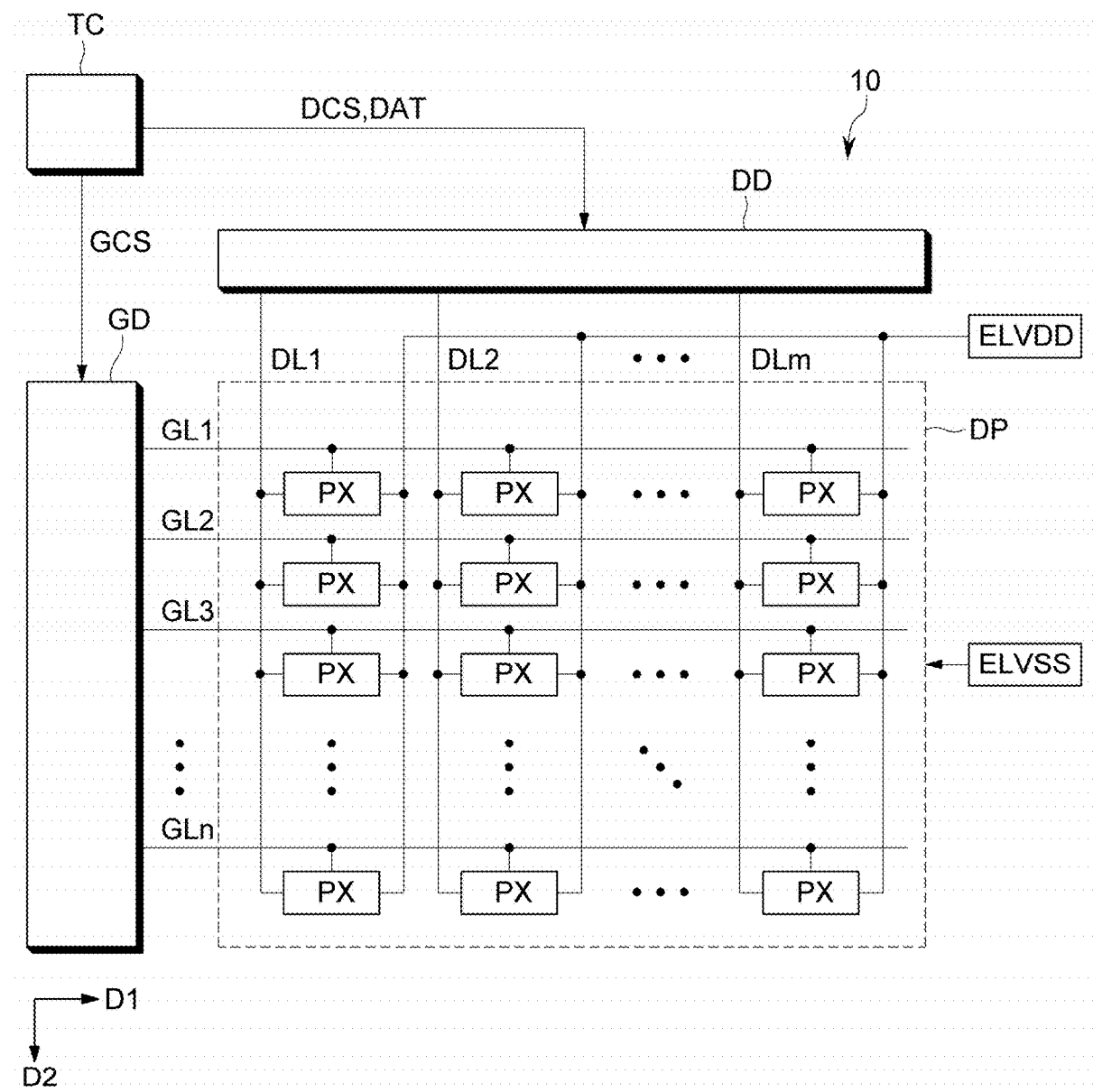
FIG. 1 is a block diagram illustrating an exemplary embodiment of an organic light emitting diode ("OLED") display device.

Exemplary embodiments will now be described more fully hereinafter with reference to the accompanying drawings. Although the invention may be modified in various manners and have several embodiments, embodiments are illustrated in the accompanying drawings and will be mainly described in the specification. However, the scope of the invention is not limited to the exemplary embodiments and should be construed as including all the changes, equivalents and substitutions included in the spirit and scope of the invention.

In the drawings, thicknesses of a plurality of layers and areas are illustrated in an enlarged manner for clarity and ease of description thereof. When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "lower", "above", "upper" and the like, may be used herein for ease of description to describe the relations between one element or component and another element or component as illustrated in the drawings. It will be understood that the spatially relative terms are intended to encompass different orientations of the device in use or operation, in addition to the orientation illustrated in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in the other direction and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined at the specification.

Some of the parts which are not associated with the description may not be provided in order to specifically describe embodiments of the invention and like reference numerals refer to like elements throughout the specification.

Hereinafter, an exemplary embodiment will be described with reference to FIGS. 1 to 6.

FIG. 1 is a block diagram illustrating an exemplary embodiment of an organic light emitting diode ("OLED") display device 10.

Referring to FIG. 1, an OLED display device 10 in an exemplary embodiment includes a display panel DP, a timing controller TC, a gate driver GD, and a data driver DD.

The timing controller TC receives image data externally applied thereto and outputs an image data signal DAT that is converted in accordance with a driving mode of the display panel DP to the data driver DD. In addition, the timing controller TC generates a gate driving control signal GCS and a data driving control signal DCS using horizontal and/or vertical synchronization signals and a clock signal, and output them to the gate driver GD and the data driver DD, respectively.

The gate driver GD receives the gate driving control signal GCS from the timing controller TC and generates a plurality of gate signals. The plurality of gate signals is sequentially applied to the display panel DP.

The data driver DD receives the data driving control signal DCS and the converted image data signal DAT from the timing controller TC. The data driver DD generates a plurality of data signals based on the data driving control signal DCS and the converted image data signal DAT. The plurality of data signals are applied to the display panel DP.

The display panel DP may receive an electric signal from the outside and display images. The display panel DP includes a plurality of gate lines GL1 to GLn, a plurality of data lines DL1 to DLm insulated from and intersecting the plurality of gate lines GL1 to GLn, and a plurality of pixels PX electrically connected to the plurality of data lines DL1 to DLm and the plurality of gate lines GL1 to GLn where n and m are natural numbers.

Although each of the plurality of pixels PX in an exemplary embodiment is depicted to have a substantially quadrangular shape, the invention is not limited thereto. In another exemplary embodiment, each of the plurality of pixels PX may have various shapes, e.g., a substantially circular, rhombic, or octagonal shape. In addition, although each of the plurality of pixels PX in an exemplary embodiment is depicted to be arranged in a matrix, the invention is not limited thereto.

Each of the gate lines GL1 to GLn may extend along a first direction D1, and may be arranged along a second direction D2 that intersects the first direction D1. The gate lines GL1 to GLn sequentially receive the gate signals from the gate driver GD.

Each of the data lines DL1 to DLm may extend along the second direction D2 and may be arranged along the first direction D1. The data lines DL1 to DLm receive the data signals from the data driver DD.

The display panel DP may receive a first power voltage ELVDD and a second power voltage ELVSS from the outside. Each of the pixels PX may be turned on in response to a corresponding gate signal. Each of the pixels PX receives the first power voltage ELVDD and the second power voltage ELVSS, and is capable of generating light in response to a corresponding data signal. The first power voltage ELVDD may have a voltage level higher than that of the second power voltage ELVSS.

Each of the pixels PX may receive the gate signal from the corresponding gate line, and receive the data signal from the corresponding data line. Each of the pixels PX may be turned on in response to a corresponding gate signal. Each of the pixels PX may generate light corresponding to the corresponding data signal to display images.

The pixels PX may exhibit various colors, and in an exemplary embodiment, each pixel PX may emit one of red light, green light, blue light, and white light, for example.

Figure 2:
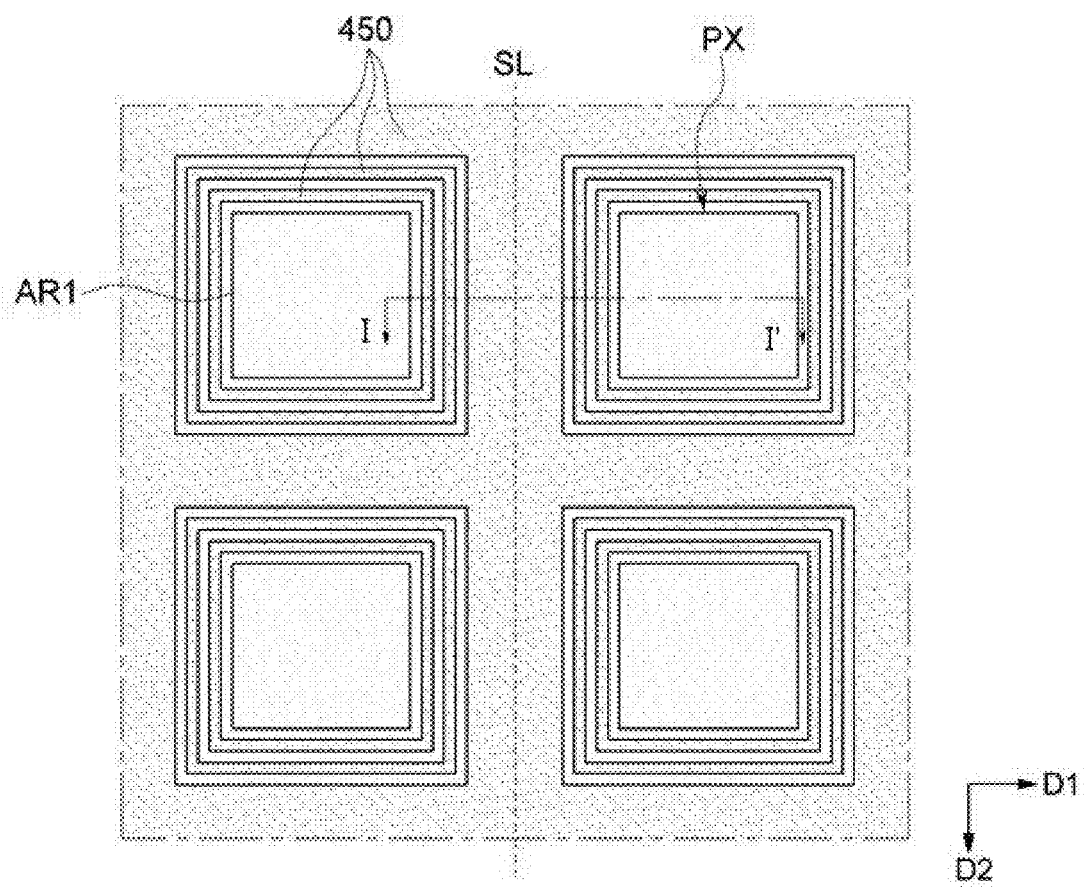
FIG. 2 is a plan view schematically illustrating an exemplary embodiment of a plurality of pixels.
Figure 3:
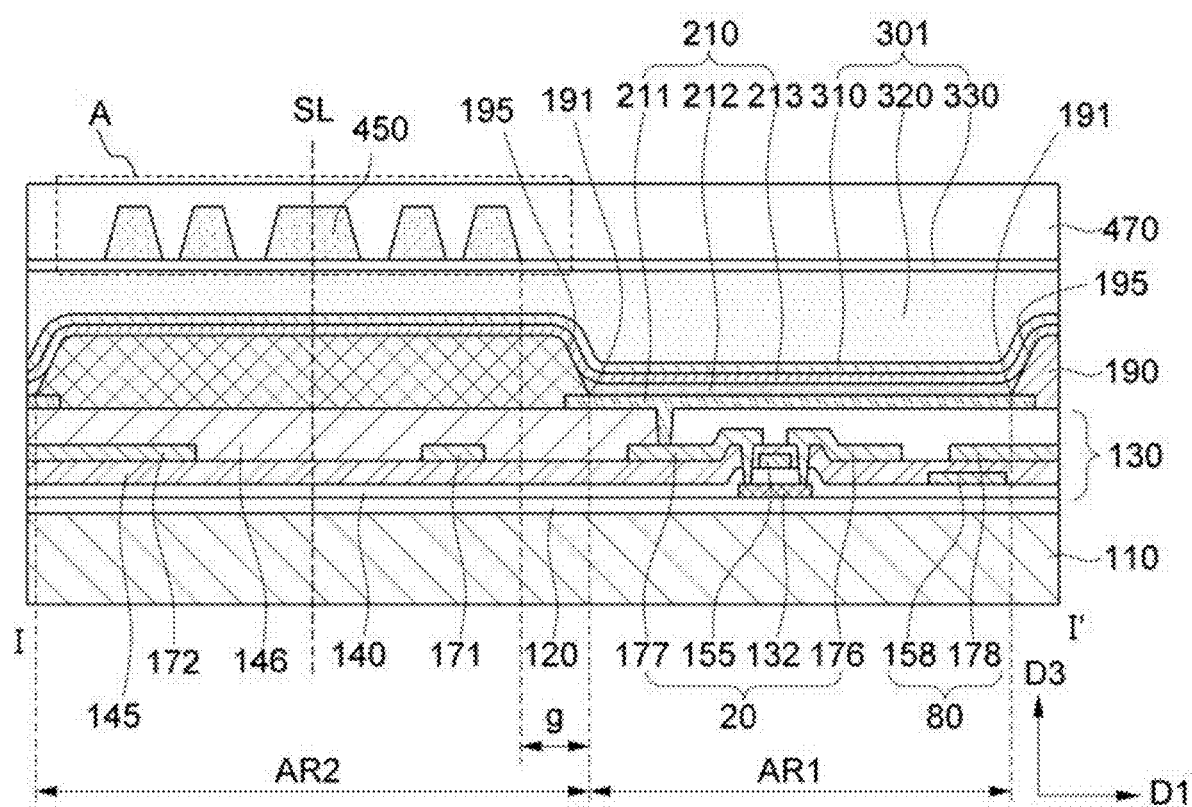
FIG. 3 is a cross-sectional view taken along line I-I' of FIG. 2.

FIG. 2 is a plan view schematically illustrating an exemplary embodiment of a plurality of pixels, and FIG. 3 is a cross-sectional view taken along line I-I' of FIG. 2.

Referring to FIGS. 2 and 3, an OLED display device 10 in an exemplary embodiment includes a substrate 110, a buffer layer 120, a driving circuit unit 130, a pixel defining layer 190, an OLED 210, a thin film encapsulation layer 301, a plurality of barrier ribs 450, and a planarization layer 470.

In an exemplary embodiment, the substrate 110 may include an insulating material, e.g., glass, quartz, ceramic, and plastic. A material forming the substrate 110 may include materials having excellent mechanical strength, thermal stability, transparency, surface smoothness, ease of handling, and water resistance. The substrate 110 may be flexible, stretchable, foldable, bendable, or rollable, for example. As the substrate 110 is flexible, stretchable, foldable, bendable, or rollable, the OLED display device 10 may be flexible, stretchable, foldable, bendable, or rollable.

The buffer layer 120 is disposed on the substrate 110. The buffer layer 120 may include at least one layer including various inorganic layers and organic layers. The buffer layer 120 serves to prevent unnecessary substances, e.g., impurities or moisture, from penetrating into the driving circuit unit 130 or the OLED 210, and to flatten a surface therebelow. However, the buffer layer 120 is not necessarily desired and may be omitted in another exemplary embodiment.

The driving circuit unit 130 is disposed on the buffer layer 120. The driving circuit unit 130 corresponds to a portion including a plurality of thin film transistors ("TFTs") 20 and a capacitor 80, and drives the OLED 210. The driving circuit unit 130 includes gate lines (GL1 to GLn in FIG. 1) arranged along one direction, a data line 171 and a common power line 172 insulated from and intersecting the gate lines. The OLED 210 emits light according to a driving signal received from the driving circuit unit 130 to display images.

The OLED display device 10 in an exemplary embodiment may have a 2Tr-1Cap structure which includes, for example, two TFTs 20 and one capacitor 80 in each pixel PX, or may have various structures which include, for example, three or more TFTs 20 and two or more capacitors 80 in each pixel PX.

The capacitor 80 includes first and second capacitor plates 158 and 178 with an insulating interlayer 145 therebetween. In such an exemplary embodiment, the insulating interlayer 145 may be a dielectric element. A capacitance of the capacitor 80 is determined by electric charges accumulated in the capacitor 80 and a voltage between the first and second capacitor plates 158 and 178.

The TFT 20 includes a semiconductor layer 132, a gate electrode 155, a source electrode 176, and a drain electrode 177. The semiconductor layer 132 and the gate electrode 155 are insulated by a gate insulating layer 140. The TFT 20 applies, to a first pixel electrode 211, a driving power which allows an organic light emitting layer 212 of the OLED 210 in a selected pixel to emit light. In such an exemplary embodiment, the gate electrode 155 is connected to the first capacitor plate 158, each of the source electrode 176 and the second capacitor plate 178 is connected to the common power line 172, and the drain electrode 177 is connected to the first pixel electrode 211 of the OLED 210 through a contact hole defined in a passivation layer 146.

The passivation layer 146 is disposed on the insulating interlayer 145. The passivation layer 146 includes an insulating material, and protects the driving circuit unit 130. In an exemplary embodiment, the passivation layer 146 may include at least one of, for example, an acrylic resin, an epoxy resin, a phenolic resin, a polyamide resin, a polyimide resin, an unsaturated polyester resin, a polyphenylene resin, a polyphenylene sulfide resin, and benzocyclobutene ("BCB"). In addition, the passivation layer 146 may include a material substantially the same as a material included in the insulating interlayer 145.

The first electrode 211 is disposed on the passivation layer 146. In an exemplary embodiment, the first electrode 211 may be a pixel electrode, and may be an anode. The first electrode 211 has conductivity, and may be a transmissive electrode, a transflective electrode, or a reflective electrode.

When the first electrode 211 is a transmissive electrode, the first electrode 211 includes a transparent conductive oxide. In an exemplary embodiment, at least one of, for example, indium tin oxide ("ITO"), indium zinc oxide ("IZO"), zinc oxide (ZnO) and indium tin zinc oxide ("ITZO") may be used as the transparent conductive oxide. In an exemplary embodiment, when the first electrode 211 is a transflective electrode or a reflective electrode, the first electrode 211 may include at least one of, for example, Ag, Mg, Al, Pt, Pd, Au, Ni, Nd, Ir, Cr and Cu.

The pixel defining layer 190 for dividing a light emission area through which light is emitted is disposed on the passivation layer 146. In such an exemplary embodiment, the light emission area is also referred to as a pixel area. Hereinafter, for convenience of description, the light emission area divided by the pixel defining layer 190 is referred to as a first region AR1, and a region except the first region AR1 is referred to as a second region AR2. That is, the first region AR1 may be defined as a region at which the pixel defining layer 190 is not disposed, and the second region AR2 may be defined as a region at which the pixel defining layer 190 is disposed.

Specifically, a plurality of openings 195 corresponding to the plurality of pixels PX may be defined in the pixel defining layer 190, respectively. At least a part of the first electrode 211 is exposed from the pixel defining layer 190 through each of the openings 195. That is, the opening 195 may be defined as a part of an area above the first electrode 211 that does not overlap the pixel defining layer 190. In addition, a boundary where the pixel defining layer 190 contacts the first electrode 211 at the opening 195 is defined as an edge 191 of the opening 195. Accordingly, in a plan view, an area inside the edge 191 of the opening 195 may be referred to as the first region AR1, and an area outside the edge 191 of the opening 195 may be referred to as the second region AR2.

Each of the edges 191 of the plurality of openings 195 may have a shape similar to that of the first electrode 211 in a plan view. In an exemplary embodiment, each of the first electrode 211 and the edge 191 of the opening 195 may have a quadrangular shape in a plan view, for example, but the invention is not limited thereto.

The pixel defining layer 190 may include a polymer organic material. In an exemplary embodiment, the pixel defining layer 190 may include at least one of, for example, a polyimide ("PI") resin, a polyacrylic resin, a polyethylene terephthalate ("PET") resin, and a polyethylene naphthalate ("PEN") resin.

The organic light emitting layer 212 is disposed on the first electrode 211. Specifically, the organic light emitting layer 212 is disposed at the opening 195 on the first electrode 211. Although the organic light emitting layer 212 in an exemplary embodiment is depicted as being disposed only at the opening 195 on the first electrode 211, the invention is not limited thereto. In another exemplary embodiment, the organic light emitting layer 212 may be disposed at a side wall of the pixel defining layer 190 that defines the opening 195 or a portion above the pixel defining layer 190.

The organic light emitting layer 212 includes a light emitting material. In addition, the organic light emitting layer 212 may include a host and a luminescent dopant. The organic light emitting layer 212 may be manufactured using a known material by a known method. In an exemplary embodiment, the organic light emitting layer 212 may be provided by various methods, for example, vacuum deposition, spin coating, casting, langmuir-blodgett ("LB"), ink-jet printing, laser printing, and laser induced thermal imaging ("LITT").

A second electrode 213 is disposed on the organic light emitting layer 212. The second electrode 213 may be a common electrode, and may be a cathode. The second electrode 213 may be a transmissive electrode, a transflective electrode, or a reflective electrode.

In an exemplary embodiment, when the second electrode 213 is a transmissive electrode, the second electrode 213 may include at least one of, for example, Li, Ca, LiF/Ca, LiF/Al, Al, Mg, BaF, Ba, Ag, and Cu. In an exemplary embodiment, the second electrode 213 may include a combination of Ag and Mg, for example. When the second electrode 213 is a transflective electrode or a reflective electrode, the second electrode 213 may include at least one of, for example, Ag, Mg, Al, Pt, Pd, Au, Ni, Nd, Ir, Cr, Li, Ca, LiF/Ca, LiF/Al, Mo, Ti and Cu, for example. In addition, the second electrode 213 may further include a transparent conductive layer which includes, for example, ITO, IZO, zinc oxide (ZnO), and IZTO, in addition to the transflective electrode or the reflective electrode.

Although not illustrated, at least one of a hole injection layer ("HIL") and a hole transport layer ("HTL") may be disposed between the first electrode 211 and the organic light emitting layer 212, and at least one of an electron transport layer ("ETL") and an electron injection layer ("EIL") may be disposed between the organic light emitting layer 212 and the second electrode 213.

When the OLED 210 is a top emission type, the first electrode 211 may be a reflective electrode, and the second electrode 213 may be a transmissive electrode or a transflective electrode. When the OLED 210 is a bottom emission type, the first electrode 211 may be a transmissive electrode or a transflective electrode, and the second electrode 213 may be a reflective electrode.

A thin film encapsulation layer 301 is disposed on the second electrode 213 to protect the OLED 210. The thin film encapsulation layer 301 substantially prevents an outside air such as moisture or oxygen from penetrating into the OLED 210.

The thin film encapsulation layer 301 includes at least one inorganic layer 310 and 330 and at least one organic layer 320 that are alternately disposed. Referring to FIG. 3, the thin film encapsulation layer 301 in an exemplary embodiment is depicted as including two inorganic layers 310 and 330 and one organic layer 320, but the invention is not limited thereto.

In an exemplary embodiment, the inorganic layers 310 and 330 include an inorganic material including at least one of $Al_2O_3$, $TiO_2$, $ZrO$, $SiO_2$, AlON, AlN, SiON, $Si_3N_4$, ZnO, and $Ta_2O_5$, silicon oxides and silicon nitrides. The inorganic layers 310 and 330 may be provided through methods such as a chemical vapor deposition ("CVD") method or an atomic layer deposition ("ALD") method. However, the invention is not limited thereto, and the inorganic layers 310 and 330 may be provided through various methods known to those skilled in the pertinent art.

The organic layer 320 may include a polymer-based material. Examples of the polymer-based material may include, for example, an acrylic resin, an epoxy resin, polyimide and polyethylene. The organic layer 320 may be provided through a thermal deposition process. The thermal deposition process for forming the organic layer 320 may be performed in a range of temperature that may not damage the OLED 210. However, the invention is not limited thereto, and the organic layer 320 may be provided through various methods known to those skilled in the pertinent art.

The inorganic layers 310 and 330 which have a high density of thin film may substantially prevent or efficiently reduce permeation of, mostly, moisture or oxygen. Permeation of moisture and oxygen into the OLED 210 may be largely prevented by the inorganic layers 310 and 330.

Moisture and oxygen that have passed through the inorganic layers 310 and 330 may further be blocked by the organic layer 320. The organic layer 320 may have relatively low permeation prevention efficiency as compared to the inorganic layers 310 and 330. However, the organic layer 320 may also serve as a buffer layer to reduce stress between one of the inorganic layers 310 and 330 and another of the inorganic layers 310 and 330, in addition to the moisture permeation preventing function. Further, since the organic layer 320 has planarizing characteristics, an uppermost surface of the thin film encapsulation layer 301 may be planarized by virtue of the organic layer 320.

The plurality of barrier ribs 450 is disposed on the thin film encapsulation layer 301. Particularly, the plurality of barrier ribs 450 may be disposed contacting an uppermost inorganic layer 330 of the thin film encapsulation layer 301. The plurality of barrier ribs 450 overlaps the pixel defining layer 450 in a third direction D3 that is perpendicular to the substrate 110. That is, the plurality of barrier ribs 450 may not be disposed at the first region AR1, but may be disposed only at the second region AR2.

Each of the plurality of barrier ribs 450 has a closed loop shape enclosing adjacent one of the first regions AR1 in a plan view, as illustrated in FIG. 2. Although each of the plurality of barrier ribs 450 in an exemplary embodiment is depicted as having a substantially quadrangular shape in a plan view, the invention is not limited thereto. In another exemplary embodiment, each of the plurality of barrier ribs 450 may have various shapes, e.g., a substantially circular, rhombic or octagonal shape.

In addition, the plurality of barrier ribs 450 is disposed between two adjacent ones of the first electrodes 211, and are in the form symmetric to an imaginary straight line SL that passes through a center of the pixel defining layer 190 between the two adjacent ones of the first electrodes 211 and is perpendicular to the substrate 110. In such an exemplary embodiment, the imaginary straight line SL may extend along the third direction D3 that is perpendicular to the substrate 110, and may be a reference line that defines line symmetry of the plurality of barrier ribs 450.

The plurality of barrier ribs 450 has a refractive index relatively lower than a refractive index of the uppermost inorganic layer 330 and the planarization layer 470, to be described below, which directly contact the plurality of barrier ribs 450. In an exemplary embodiment, the plurality of barrier ribs 450 may have a refractive index in a range from about 1.40 to about 1.59, for example. In an exemplary embodiment, each of the plurality of barrier ribs 450 in an exemplary embodiment may have a refractive index of about 1.50, for example. The plurality of barrier ribs 450 may include a light transmissive organic material having a relatively low refractive index. In an exemplary embodiment, the plurality of barrier ribs 450 may include at least one of, for example, an acrylic resin, a polyimide resin, a polyamide resin, and tris(8-hydroxyquinolinato)aluminum ($Alq_3$), for example.

The plurality of barrier ribs 450 is disposed, in a plan view, apart from the first region AR1 at which the first electrode 211, the organic light emitting layer 212, and the second electrode 213 overlap each other. In addition, each of the plurality of barrier ribs 450 has opposite side surfaces, and each of the opposite side surfaces has a predetermined angle with respect to the substrate 110. That is, the plurality of barrier ribs 450 may have a tapered shape, which will be described in detail below.

The planarization layer 470 is disposed on the thin film encapsulation layer 301 and the plurality of barrier ribs 450. In particular, the planarization layer 470 may contact the uppermost inorganic layer 330 of the thin film encapsulation layer 301 and the plurality of barrier ribs 450. The planarization layer 470 may be disposed covering an entire upper surface of the substrate 110. The planarization layer 470 may be provided sufficiently thick so that its upper surface may be flat.

The planarization layer 470 has a refractive index relatively higher than the refractive index of the plurality of barrier ribs 450 that directly contacts the planarization layer 470. In an exemplary embodiment, the planarization layer 470 may have a refractive index in a range from about 1.60 to about 1.80, for example. In an exemplary embodiment, the planarization layer 470 in an exemplary embodiment may have a refractive index of about 1.65. The planarization layer 470 may include a light transmissive organic material that has a relatively high refractive index.

In addition, although not illustrated, the OLED display device 10 in another exemplary embodiment may further include a polarizing plate, an adhesive layer, and a window disposed on the planarization layer 470.

As the OLED display device 10 in an exemplary embodiment includes the plurality of barrier ribs 450 and the planarization layer 470 disposed on the thin film encapsulation layer 301, outgoing light efficiency and frontal visibility of the OLED display device 10 may be improved. In other words, since at least a part of the light generated in the OLED 210 is reflected according to a difference in refractive index at an interface between the plurality of barrier ribs 450 and the planarization layer 470, light may be condensed toward a front surface, which will be described in detail with reference to FIG. 4.

Figure 4:
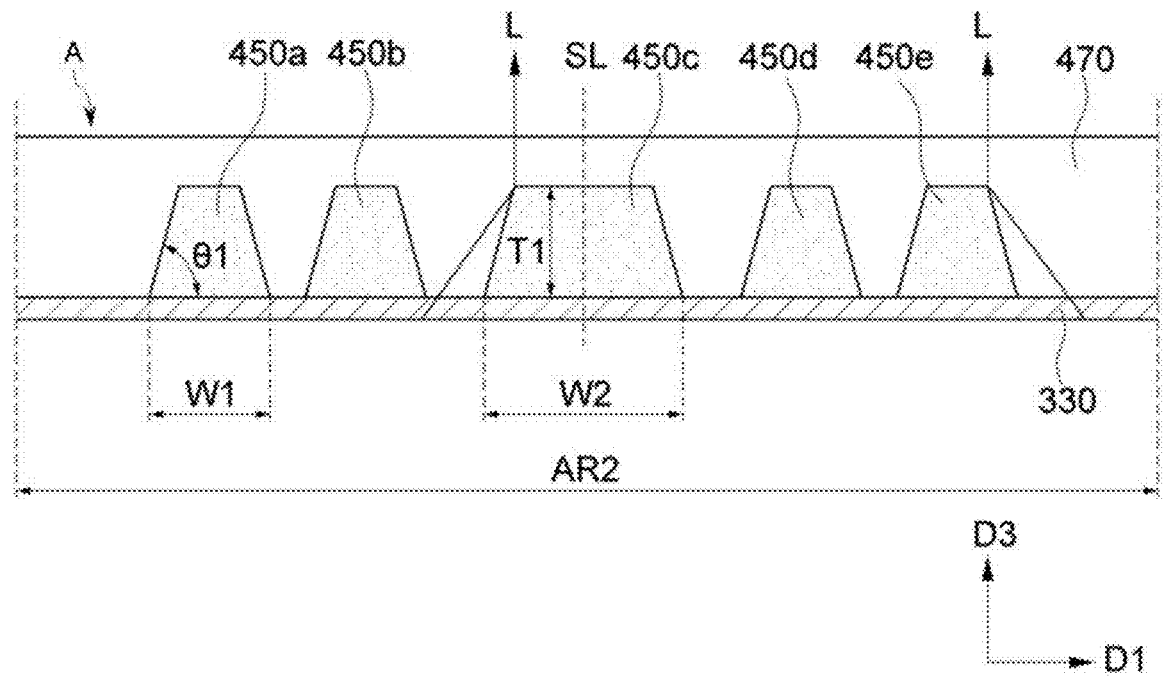
FIG. 4 is an enlarged cross-sectional view illustrating area A in FIG. 3.

FIG. 4 is an enlarged cross-sectional view illustrating area A in FIG. 3. Particularly, FIG. 4 is an enlarged view illustrating the uppermost inorganic layer 330 of the thin film encapsulation layer 301, the plurality of barrier ribs 450, and the planarization layer 470. Further, FIG. 4 is for explaining reflection of light at the interface between the plurality of barrier ribs 450 and the planarization layer 470, and arrows in FIG. 4 represent optical paths.

Referring to FIGS. 3 and 4, a part of light L generated in the OLED 210 may be incident with an inclination to an upper portion of the thin film encapsulation layer 301. In such an exemplary embodiment, when an incidence angle of the light L incident to the planarization layer 470 is greater than a critical angle, the incident light L may be totally reflected at an interface between the barrier ribs 450 and the planarization layer 470. In an exemplary embodiment, as illustrated in FIG. 4, the OLED display device 10 may include five barrier ribs 450*a*, 450*b*, 450*c*, 450*d*, and 450*e* disposed between adjacent ones of the OLEDs 210, for example. In such an exemplary embodiment, the light L incident to the planarization layer 470 that has a relatively high refractive index may advance toward at least a part (e.g., barrier ribs 450*c* and 450*e*) of the plurality of barrier ribs 450*a*, 450*b*, 450*c*, 450*d*, and 450*e* that have a relatively low refractive index. Further, when the incidence angle of the incident light L is greater than the critical angle, the light L may be totally reflected at the interface between the barrier ribs 450*c* and 450*e* and the planarization layer 470.

In order to totally reflect the light L incident through the planarization layer 470A to the plurality of barrier ribs 450, the taper angle θ1 of the plurality of barrier ribs 450 may be determined according to the following Inequality 1.

$$\text{asin} d\left(\frac{n1}{n2}\right) \le \theta 1 < 90°$$ [Inequality 1]

(n1 denotes refractive index of the plurality of barrier ribs, n2 denotes refractive index of the planarization layer, and θ1 denotes taper angle of the plurality of barrier ribs)

In an exemplary embodiment, when the refractive index of the plurality of barrier ribs 450 is 1.50 and the refractive index of the planarization layer 470 is 1.65, each of the taper angles θ1 of the plurality of barrier ribs 450 may be about 65.38 degrees (a sin d(1.5/1.65)) or more and less than about 90 degrees, for example. In other words, the interface between the plurality of barrier ribs 450 and the planarization layer 470 may define an angle θ1 of about 65.38 degrees or more and less than about 90 degrees. In other words, each of side surfaces of the plurality of barrier ribs 450 may form an angle θ1 of about 65.38 degrees or more and less than about 90 degrees in a cross-sectional view with the inorganic layer 330 at which the plurality of barrier ribs 450 are disposed.

That is, in the OLED display device 10 in an exemplary embodiment, the light incident to a barrier rib 450 having a substantially low refractive index through the planarization layer 470 is totally reflected and emitted toward the front surface of the OLED display device 10, and the outgoing light efficiency and front visibility of the OLED display device 10 may be improved.

In addition, the plurality of barrier ribs 450 in an exemplary embodiment is disposed at the second region AR2 to be spaced apart from the first region AR1 in a plan view. That is, the plurality of barrier ribs 450 are disposed apart from the edge 191 of the opening 195 of the pixel defining layer 190. In an exemplary embodiment, as illustrated in FIG. 3, a horizontal gap g between the first region AR1 and one of the barrier ribs 450 that is adjacent thereto may be in a range from about 0.5 micrometer (μm) to about 3.0 μm in a plan view, for example. In addition, a thickness T1 of each of the plurality of barrier ribs 450 may be in a range from about 4.0 μm to about 8.0 μm, which will be described in detail with reference to FIGS. 5 and 6.

Figure 5:
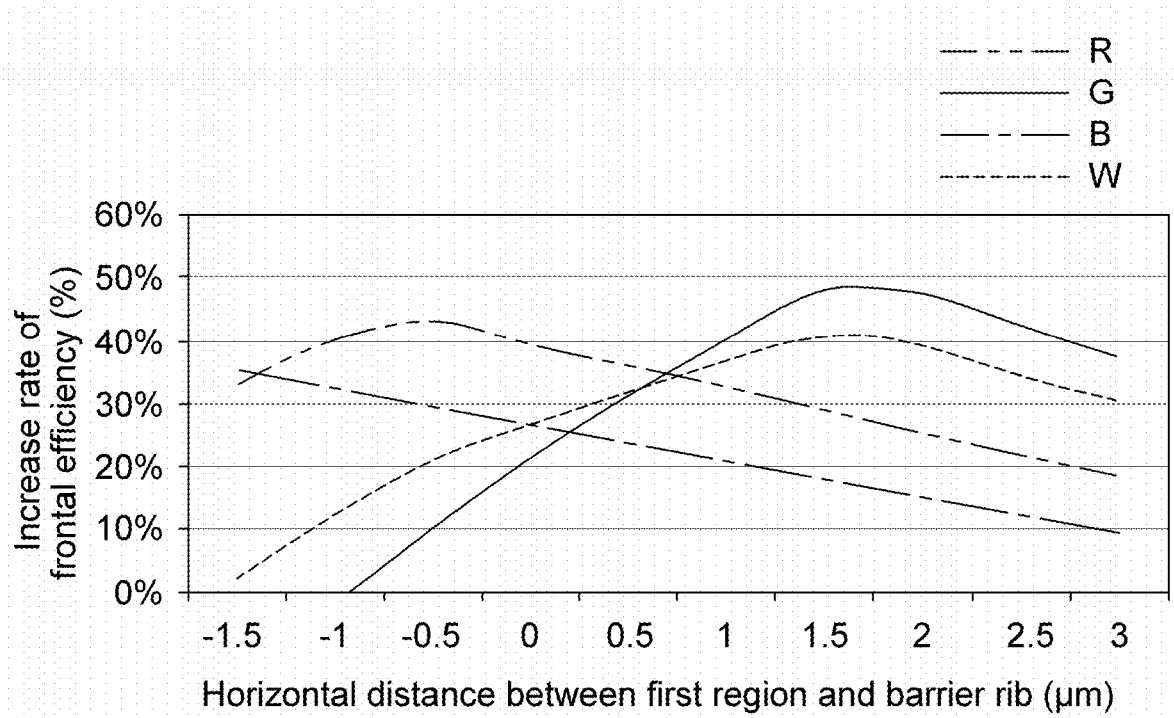
FIG. 5 is a graph illustrating an exemplary embodiment of an increase rate of frontal efficiency according to a horizontal distance between a first region and a barrier rib of an OLED display device.
Figure 6:
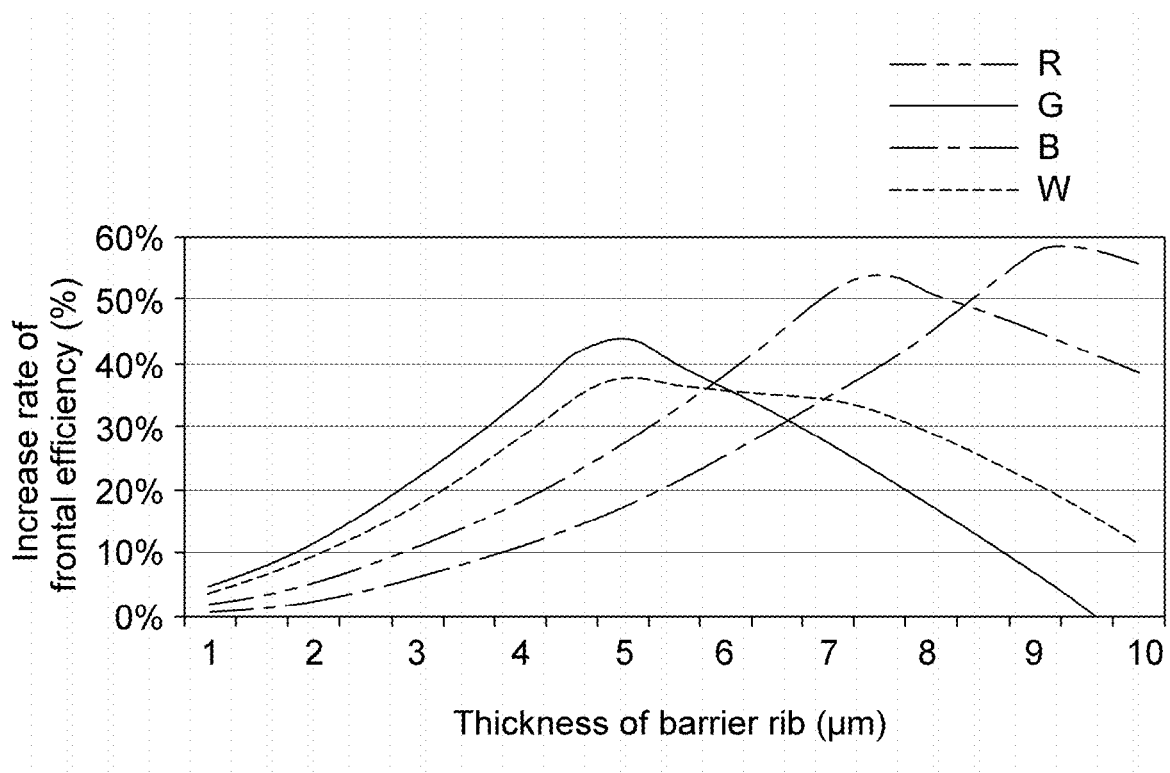
FIG. 6 is a graph illustrating an exemplary embodiment of an increase rate of frontal efficiency according to a thickness of a barrier rib of an OLED display device.

FIG. 5 is a graph illustrating an increase rate of frontal efficiency according to the horizontal distance g between the first region AR1 and the barrier rib 450 of the OLED display device 10 in an exemplary embodiment, and FIG. 6 is a graph illustrating an increase rate of frontal efficiency according to the thickness of the barrier rib 450 of the OLED display device 10 in an exemplary embodiment. As used herein, the increase rate of frontal efficiency means a rate of an increase in an amount of light emitted toward the front surface of the OLED display device 10.

Referring to FIGS. 3, 4, and 5, it is appreciated that as the horizontal gap g between the barrier rib 450 and the first region AR1 through which the OLED 210 emits light L increases, the increase rate of frontal efficiency gradually increases and then decreases again at a certain point. As used herein, the horizontal gap g is a horizontal distance between the first region AR1 and a barrier rib (for example, 450*e* in FIG. 4) of the plurality of barrier ribs 450 that is closest to the first region AR1, and means a shortest horizontal distance between the first region AR1 and the plurality of barrier ribs 450.

As illustrated in FIG. 5, maximum points in increase rates of frontal efficiencies of red light, green light and blue light according to the horizontal gap g are different from each other. With respect to the white light, when the horizontal gap g between the first region AR1 representing white W and the barrier rib 450 is about 1.5 μm, the increase rate of frontal efficiency is about 40%, which is the highest. It may also be appreciated that when the horizontal gap g between the first region AR1 and the barrier rib 450 is about 0.5 μm or more and about 3 μm or less, the increase rate of frontal efficiency is about 30% or more. Accordingly, the horizontal gap g between the first region AR1 and the barrier rib 450 in an exemplary embodiment may be in a range from about 0.5 μm to about 3 μm. More preferably, the horizontal gap g between the first region AR1 and the barrier rib 450 may be about 1.5 μm, for example.

However, the invention is not limited thereto, and since the maximum points in increase rates of frontal efficiencies of the red light, the green light, and the blue light according to the horizontal gap g are different from each other, pixels representing different colors may be spaced apart from corresponding ones of the barrier ribs 450 by different gaps, respectively. In an exemplary embodiment, since the increase rate of frontal efficiency has a maximum value when the horizontal gap g between the first region AR1 representing green G and the barrier rib 450 is about 1.5 μm, and since the increase rate of frontal efficiency has a maximum value, as the horizontal gap g between the first region AR1 representing red R or blue B and the barrier rib 450 decreases, the horizontal gap g between the first region AR1 representing green G and the barrier rib 450 may be about 1.5 μm, and the horizontal gap g between the first region AR1 representing red R or blue B and the barrier rib 450 may be about 0.5 μm, for example.

Referring to FIGS. 3, 4 and 6, it may be appreciated that as the thickness T1 of the barrier rib 450 increases, the increase rate of frontal efficiency gradually increases, and then decreases again at a certain point. Although the plurality of barrier ribs 450 in an exemplary embodiment is depicted as having a substantially same thickness T1, the invention is not limited thereto. In another exemplary embodiment, the plurality of barrier ribs 450 may have thicknesses different from each other.

As illustrated in FIG. 6, maximum points in increase rates of frontal efficiencies of the red light, the green light, and the blue light according to the thickness T1 of the barrier rib 450 are different from each other. With respect to the white light, it may be appreciated that when the thickness T1 of the barrier rib 450 is about 5 μm, the increase rate of frontal efficiency is about 40 percent (%), which is the highest. In addition, it may also be appreciated that when the thickness T1 of the barrier rib 450 is about 4 μm or more and about 8 μm or less, the increase rate of frontal efficiency is about 30% or more. Accordingly, the thickness T1 of the barrier rib 450 in an exemplary embodiment may be in a range from about 4 μm to about 8 m. More preferably, the thickness T1 of the barrier rib 450 may be about 5 μm.

As described above, in an exemplary embodiment, the horizontal gap g between the first region AR1 and the barrier ribs 450 and the thickness T1 of the barrier ribs 450 are each optimized, the outgoing light efficiency and front visibility of the OLED display device 10 may be improved.

Hereinafter, another exemplary embodiment will be described with reference to FIG. 7. The description of the same configuration as that of an exemplary embodiment of the invention will be omitted for the convenience of explanation.

Figure 7:
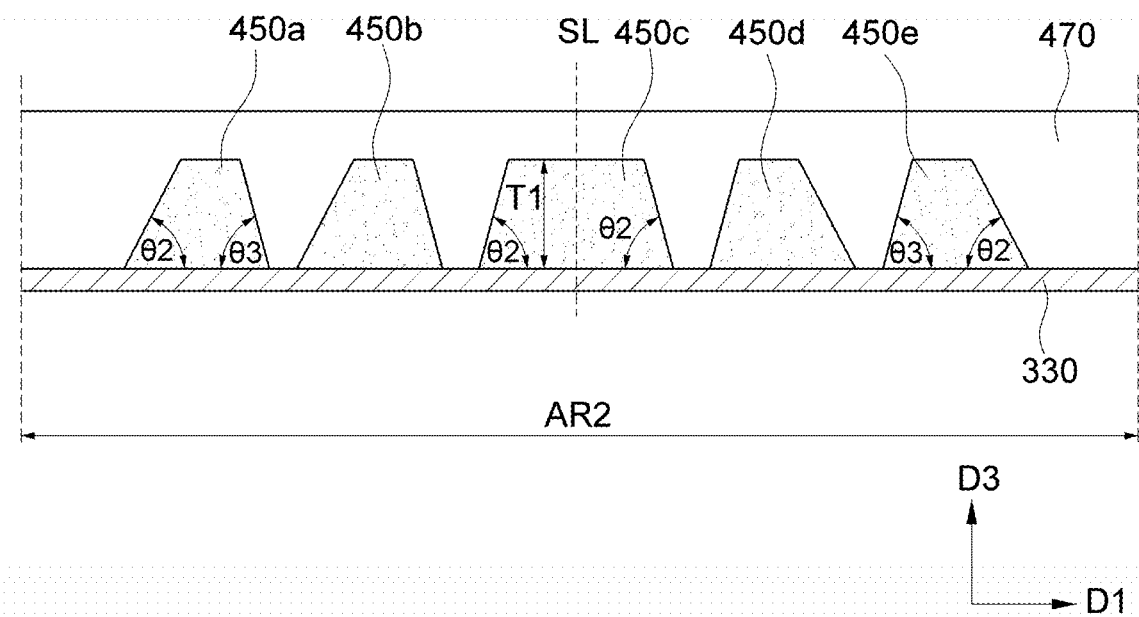
FIG. 7 is a cross-sectional view of another exemplary embodiment corresponding to area A in FIG. 3.

FIG. 7 is a cross-sectional view of another exemplary embodiment corresponding to area A in FIG. 3. Particularly, FIG. 7 is a view enlarging an upper most inorganic layer 330 of a thin film encapsulation layer 301, a plurality of barrier ribs 450a, 450b, 450c, 450d, and 450e, and a planarization layer 470.

Referring to FIG. 7, at least a part (e.g., barrier ribs 450a, 450b, 450d, and 450e) of the plurality of barrier ribs 450a, 450b, 450c, 450d, and 450e in another exemplary embodiment may have a non-isosceles trapezoidal shape in a cross-sectional view.

More specifically, each of the plurality of barrier ribs 450a, 450b, 450c, 450d, and 450e has opposite side surfaces S1 and S2, and the opposite side surfaces S1 and S2 have predetermined angles θ2 and θ3, respectively, with respect to the substrate 110. In another exemplary embodiment, opposite side surfaces S1 and S2 of a part (e.g., barrier ribs 450a, 450b, 450d, and 450e) of the plurality of barrier ribs 450a, 450b, 450c, 450d, and 450e, except the barrier rib 450c located at a center portion, respectively have inclination angles θ2 and θ3, with respect to the substrate 110, which are different from each other.

In an exemplary embodiment, an angle θ2 between the substrate 110 and one side surface S1, adjacent to an adjacent one of the first regions AR1, of opposite side surfaces S1 and S2 of each of the barrier ribs 450a, 450b, 450d, and 450e that have a non-isosceles trapezoidal shape may be less than an angle θ3 between the other side surface S2 and the substrate 110, for example. However, the invention is not limited thereto, and the angle θ2 between the substrate 110 and one side surface S1 that is adjacent to the first region AR1 may be greater than the angle θ3 between the substrate 110 and the other side surface S2.

Total reflection may substantially occur at an interface between the planarization layer 470 and one side surface S1, adjacent to the first region AR1 emitting light, of opposite side surfaces S1 and S2 of each of the plurality of barrier ribs 450a, 450b, 450c, 450d, and 450e that have a trapezoidal shape. Accordingly, the angle θ2 between the substrate 110 and one side surface S1, adjacent to the first region AR1, of opposite side surfaces S1 and S2 of each of the plurality of barrier ribs 450a, 450b, 450c, 450d, and 450e that have a trapezoidal shape may be determined according to the above Inequality 1.

However, the barrier rib 450c located at the center portion may have an isosceles trapezoidal shape in a cross-sectional view. That is, opposite side surfaces of the barrier rib 450c located at the center portion may have a substantially same angle θ2 with respect to the substrate 110.

In addition, the plurality of barrier ribs 450a, 450b, 450c, 450d, and 450e disposed at the second region AR2 is in the form that they are symmetric with respect to an imaginary straight line SL that passes through a center of a pixel defining layer 190 (refer to FIG. 3) between two adjacent ones of first electrodes 211 and is perpendicular to the substrate 110. In such an exemplary embodiment, the imaginary straight line SL may extend along the third direction D3 perpendicular to the substrate 110 and may be a reference line that defines line symmetry of the plurality of barrier ribs 450.

Hereinafter, another exemplary embodiment will be described with reference to FIG. 8. The description of the same configuration as that of an exemplary embodiment of the invention will be omitted for the convenience of explanation.

Figure 8:
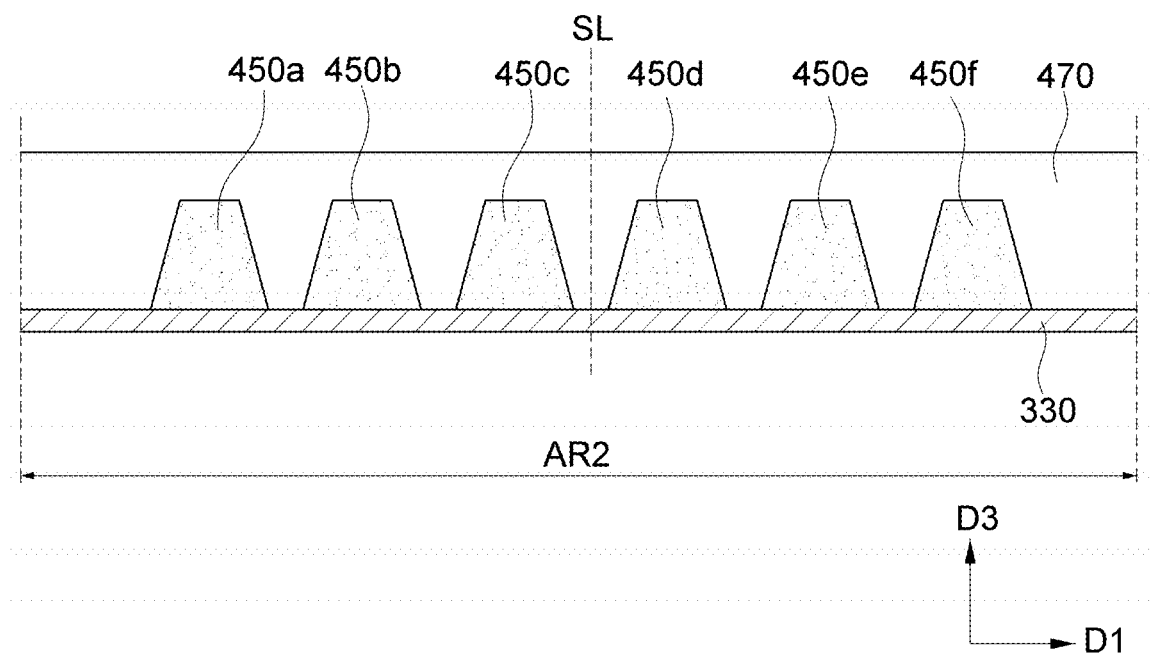
FIG. 8 is a cross-sectional view of another exemplary embodiment corresponding to area A in FIG. 3.

FIG. 8 is a cross-sectional view of another exemplary embodiment corresponding to area A in FIG. 3. Particularly, FIG. 8 is a view enlarging an upper most inorganic layer 330 of a thin film encapsulation layer 301, a plurality of barrier ribs 450a, 450b, 450c, 450d, 450e, and 450f, and a planarization layer 470.

Referring to FIG. 8, the plurality of barrier ribs 450a, 450b, 450c, 450d, 450e and 450f in another exemplary embodiment may include an even number of barrier ribs 450a, 450b, 450c, 450d, 450e and 450f, dissimilar to an exemplary embodiment of the invention including an odd number of barrier ribs 450a, 450b, 450c, 450d, and 450e.

The plurality of barrier ribs 450a, 450b, 450c, 450d, 450e, and 450f disposed at a second region AR2 are in the form that they are symmetric with respect to an imaginary straight line SL that passes through a center of a pixel defining layer 190 between two adjacent ones of first electrodes 211 and is perpendicular to a substrate 110. In such an exemplary embodiment, the imaginary straight line SL may extend along the third direction D3 perpendicular to the substrate 110 and may be a reference line that defines line symmetry of the plurality of barrier ribs 450.

The barrier ribs 450a, 450b, 450c, 450d, 450e, and 450f, i.e., even number of the barriers, in another exemplary embodiment are not all located on the imaginary straight line SL that passes through the center of the pixel defining layer 190.

Hereinafter, another exemplary embodiment will be described with reference to FIG. 9. The description of the same configuration as that of an exemplary embodiment of the invention will be omitted for the convenience of explanation.

Figure 9:
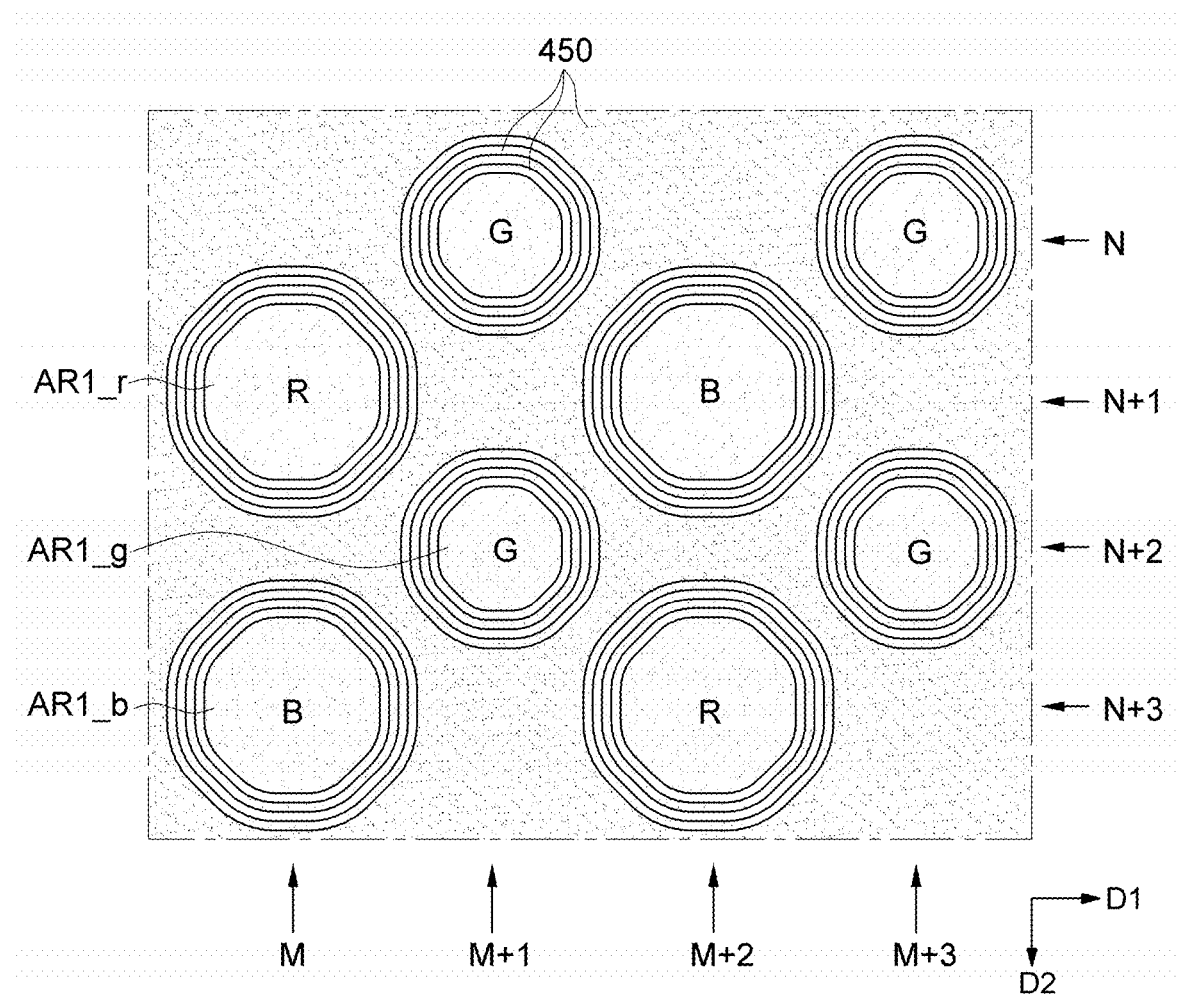
FIG. 9 is a plan view schematically illustrating another exemplary embodiment of a plurality of pixels.

FIG. 9 is a plan view schematically illustrating another exemplary embodiment of a plurality of pixels.

Referring to FIG. 9, a plurality of pixels R, G, and B in another exemplary embodiment may include a red pixel R for emitting red, a green pixel G for emitting green, and a blue pixel B for emitting blue. In such an exemplary embodiment, a red light emitting element (e.g., OLED) 210 of the red pixel R includes a red light emitting layer, a green light emitting element 210 of the green pixel G includes a green light emitting layer, and a blue light emitting element 210 of the blue pixel B includes a blue light emitting layer.

However, the invention is not limited thereto, and the plurality of pixels PX may include pixels emitting other colors, for example, cyan, magenta, and yellow.

In such an exemplary embodiment, the red pixel R, the green pixel G and the blue pixel B may include a red light emission area AR1_r, a green light emission area AR1_g and a blue light emission area AR1_b, respectively, which are divided by a pixel defining layer. In an exemplary embodiment, as illustrated in FIG. 9, each of the red light emission area AR1_r, the green light emission area AR1_g, and the blue light emission area AR1_b may have an octagonal shape similar to a rhombus in a plan view, for example. In addition, each of the red light emission area AR1_r and the blue light emission area AR1_b may have an area larger than an area of the green light emission area AR1_g in a plan view, but the invention is not limited thereto.

In addition, the plurality of pixels R, G, and B in an exemplary embodiment may have a pentile structure. In an exemplary embodiment, as illustrated in FIG. 9, the green light emission areas AR1_g may be located apart from each other at a predetermined distance in an N-th row, and the red light emission areas AR1_r and the blue light emission areas AR1_b may be alternately located in an (N+1)-th row that is adjacent to the N-th row, for example. Similarly, the green light emission areas AR1_g may be located apart from each other at a predetermined distance in an (N+2)-th row that is adjacent to the (N+1)-th row, and the blue light emission areas AR1_b and the red light emission areas AR1_r may be alternately located in an (N+3)-th row that is adjacent to the (N+2)-th row.

In addition, the plurality of green light emission areas AR1_g arranged in the N-th row may be alternately disposed with the red light emission areas AR1_r and the blue light emission areas AR1_b arranged in the (N+1)-th row. In an exemplary embodiment, the red light emission areas AR1_r and the blue light emission areas AR1_b may be alternately located in an M-th column, and the green light emission areas AR1_g may be located apart from each other at a predetermined distance in an (M+1)-th column that is adjacent to the M-th column, for example. Similarly, the blue light emission areas AR1_b and the red light emission areas AR1_r may be alternately located in an (M+2)-th column that is adjacent to the (M+1)-th column, and the green light emission areas AR1_g may be located apart from each other at a predetermined distance in an (M+3)-th column that is adjacent to the (M+2)-th column. The arrangement of the plurality of pixels R, G, B is not limited thereto, and may be variously modified.

Hereinafter, another exemplary embodiment will be described with reference to FIG. 10. The description of the same configuration as that of an exemplary embodiment of the invention will be omitted for the convenience of explanation.

Figure 10:
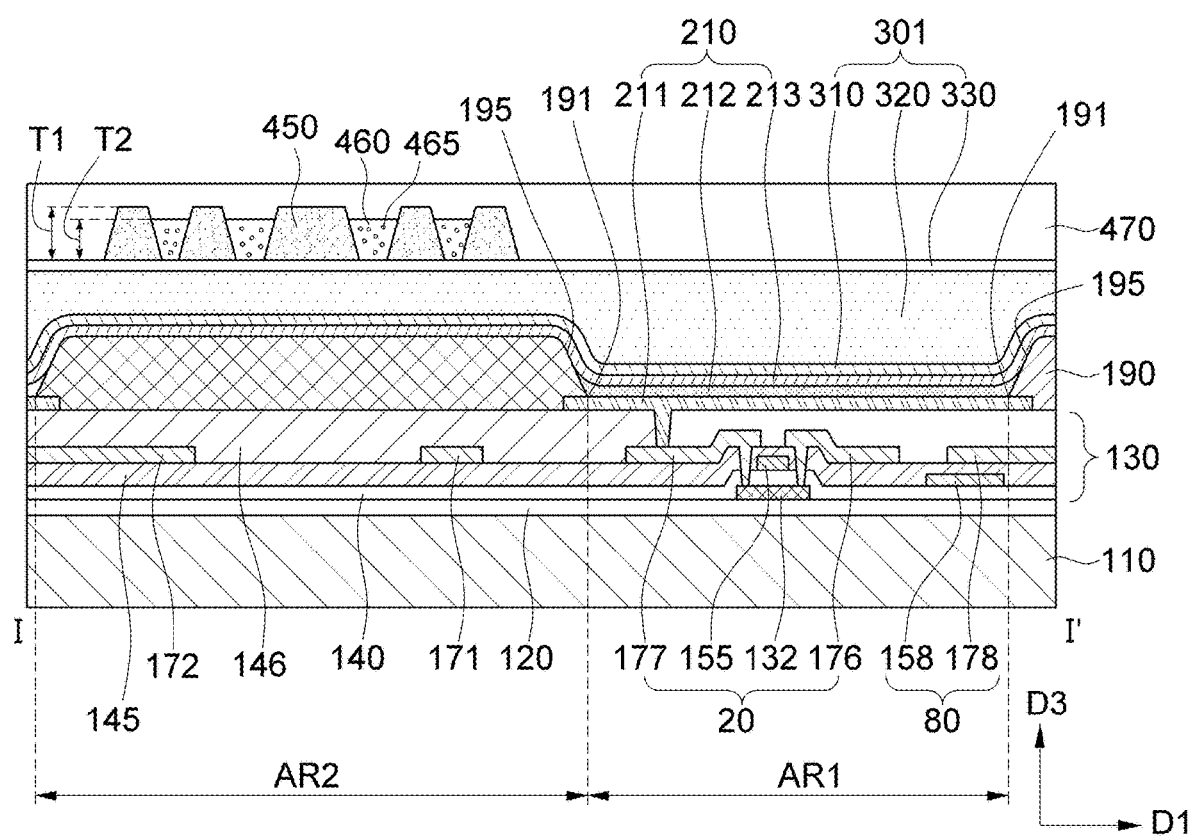
FIG. 10 is a cross-sectional view illustrating another exemplary embodiment of an OLED display device.

FIG. 10 is a cross-sectional view illustrating another exemplary embodiment of an OLED display device.

Referring to FIG. 10, as compared to the OLED display device 10 in an exemplary embodiment, an OLED display device in another exemplary embodiment further includes a scattering layer 460 overlapping a pixel defining layer 190 between a plurality of barrier ribs 450.

The scattering layer 460 may include a resin including a scatterer 465. The scatterer 465 is not particularly limited as long as it is commonly used, but in an exemplary embodiment, may include at least one of, for example, $TiO_2$, $SiO_2$ and ZnO.

The scatterer 465 scatters light incident to the scattering layer 460, thereby improving outgoing light efficiency and substantially minimizing color deviation according to a viewing angle. Specifically, the scatterer 465 has a refractive index different from a refractive index of the resin of the scattering layer 460. Accordingly, light passing through the scatterer 465 of the scattering layer 460 is refracted and scattered such that the outgoing light efficiency may be improved and the color deviation according to the viewing angle may be reduced. In an exemplary embodiment, a difference in refractive index between the resin of the scattering layer 460 and the scatterer 465 may be in a range from about 0.01 to about 0.20, for example, but the invention is not limited thereto.

The content, size, and shape, for example, of the scatterer 465 are not particularly limited and may be appropriately selected in consideration of the resin of the scattering layer 460 and the characteristics of the incident light. In an exemplary embodiment, when the scatterer 465 is spherical in shape, the scatterer 465 may have a diameter of about 1000 nanometers (nm) (i.e., 1 μm) which is about 0.1 to 5 times a wavelength (nm) of the incident light, and accordingly, scattering efficiency of visible light may be improved, for example. In addition, the scatterer 465 may include a core and a shell. When the scatterer 465 includes a core and a shell, a refractive index of the scatterer 465 may be easily adjusted to a desired value.

The scattering layer 460 may have a thickness T2 less than a thickness T1 of the barrier rib 450. When the scattering layer 460 has a large thickness, the scatterer 465 included in the scattering layer 460 reflects external light, thereby reducing a contrast ratio of the OLED display device. Specifically, since the barrier rib 450 has a thickness in a range from about 4 μm to about 8 μm, the scattering layer 460 may have a thickness T2 in a range from about 1 μm to about 8 μm, for example.

As the OLED display device in another exemplary embodiment further includes the scattering layer 460 overlapping a pixel defining layer 190 between the plurality of barrier ribs 450, the OLED display device may improve outgoing light efficiency and substantially minimize color deviation according to the viewing angle.

Hereinafter, another exemplary embodiment will be described with reference to FIG. 11. The description of the same configuration as that of an exemplary embodiment of the invention will be omitted for the convenience of explanation.

Figure 11:
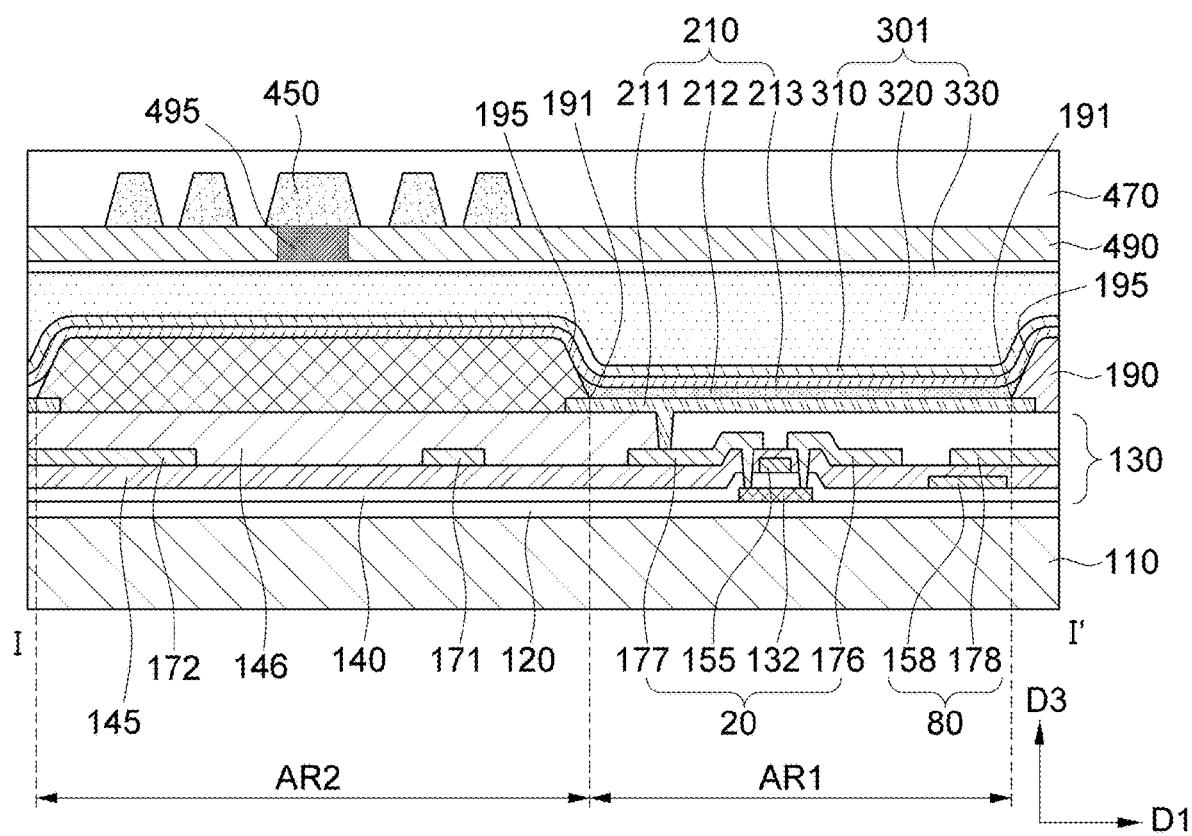
FIG. 11 is a cross-sectional view illustrating another exemplary embodiment of an OLED display device.

FIG. 11 is a cross-sectional view illustrating another exemplary embodiment of an OLED display device.

Referring to FIG. 11, as compared to the OLED display device 10 in an exemplary embodiment, an OLED display device in another exemplary embodiment further includes a color conversion layer 490 disposed between a thin film encapsulation layer 301 and a planarization layer 470.

The color conversion layer 490 may be a color filter. The color conversion layer 490, which is a color filter, may transmit light having a predetermined wavelength, and may absorb light having a wavelength other than the predetermined wavelength. In an exemplary embodiment, the color filter may include a red color filter overlapping a red organic light emitting layer, a green color filter overlapping a green organic light emitting layer, and a blue color filter overlapping a blue organic light emitting layer, for example.

The color conversion layer 490 may include a phosphor. The color conversion layer 490 including the phosphor may convert a wavelength of an incident light to generate a light having a wavelength different from the wavelength of the incident light. A phosphor is a substance that emits fluorescence when light or radiation is incident thereto, and emits a light having an inherent wavelength of the phosphor. In addition, the phosphor emits light to the entire area regardless of the direction of the light or radiation incident thereto. In an exemplary embodiment, quantum dots may be used as the phosphor, for example. In such an exemplary embodiment, the quantum dot may have at least one shape of, e.g., a rod, a pyramid, a multi-arm, a cubic nanoparticle, a nanotube, a nanowire, a nanofiber, and a nanoplate particle, other than a spherical shape.

In addition, a light blocking layer 495 may be disposed between the plurality of color conversion layers 490. The light blocking layer 495 may overlap one of a plurality of barrier ribs 450 located at a center portion, but the invention is not limited thereto.

The OLED display device in another exemplary embodiment may further improve color purity, thus improving display quality, by including the color conversion layer 490 disposed between the thin film encapsulation layer 301 and the planarization layer 470.

As set forth hereinabove, an OLED display device in one or more exemplary embodiments of the invention may improve outgoing light efficiency and frontal visibility by including a plurality of barrier ribs and a planarization layer.

While the invention has been illustrated and described with reference to the exemplary embodiments thereof, it will be apparent to those of ordinary skill in the art that various changes in form and detail may be made thereto without departing from the spirit and scope of the invention.

What is claimed is:

1. An organic light emitting display device comprising:
    a substrate;
    a plurality of first electrodes disposed on the substrate;
    a pixel defining layer disposed on the substrate and exposing at least a part of the plurality of first electrodes;
    a second electrode disposed on the plurality of first electrodes and the pixel defining layer;
    an organic light emitting layer disposed between the plurality of first electrodes and the second electrode;
    a thin film encapsulation layer disposed on the second electrode;
    a plurality of barrier ribs disposed on the thin film encapsulation layer and overlapping the pixel defining layer between two adjacent ones of the plurality of first electrodes; and
    a planarization layer disposed on the thin film encapsulation layer and the plurality of barrier ribs, and having a refractive index higher than that of the plurality of barrier ribs,
    wherein each of the plurality of barrier ribs has a closed loop shape which encloses one of the two adjacent ones of the plurality of first electrodes in a plan view.

2. The organic light emitting display device of claim 1, wherein the plurality of barrier ribs does not overlap the plurality of first electrodes.

3. The organic light emitting display device of claim 1, further comprising a scattering layer overlapping the pixel defining layer between the plurality of barrier ribs.

4. The organic light emitting display device of claim 3, wherein the scattering layer has a thickness less than a thickness of each of the plurality of barrier ribs.

5. The organic light emitting display device of claim 3, wherein the scattering layer has a thickness in a range from about 1 micrometer to about 8 micrometers.

6. The organic light emitting display device of claim 1, wherein each of the plurality of barrier ribs has an isosceles trapezoidal shape in a cross-sectional view.

7. The organic light emitting display device of claim 1, wherein at least a part of the plurality of barrier ribs each has a non-isosceles trapezoidal shape in a cross-sectional view.

8. The organic light emitting display device of claim 1, further comprising a color conversion layer disposed between the thin film encapsulation layer and the planarization layer.

9. The organic light emitting display device of claim 1, wherein the plurality of barrier ribs is linearly symmetric with respect to an imaginary straight line which passes through a center of the pixel defining layer between the two adjacent ones of the plurality of first electrodes and is perpendicular to the substrate.

10. The organic light emitting display device of claim 1, comprising a light emission area which is divided by the pixel defining layer and through which light generated from the organic light emitting layer is emitted,
    wherein the plurality of barrier ribs is disposed apart from the light emission area in the plan view.

11. The organic light emitting display device of claim 10, wherein a shortest horizontal distance between the light emission area and one of the plurality of barrier ribs which is disposed adjacent to the light emission area is in a range from about 0.5 micrometer to about 3.0 micrometers.

12. The organic light emitting display device of claim 1, wherein each of the plurality of barrier ribs has a thickness in a range from about 4.0 micrometers to about 8.0 micrometers.

13. An organic light emitting display device comprising:
    a substrate;
    a plurality of first electrodes disposed on the substrate;
    a pixel defining layer disposed on the substrate and exposing at least a part of the plurality of first electrodes;
    a second electrode disposed on the plurality of first electrodes and the pixel defining layer;
    an organic light emitting layer disposed between the plurality of first electrodes and the second electrode;
    a thin film encapsulation layer disposed on the second electrode;
    a plurality of barrier ribs disposed on the thin film encapsulation layer and overlapping the pixel defining layer between two adjacent ones of the plurality of first electrodes;
    a scattering layer overlapping the pixel defining layer between the plurality of barrier ribs; and
    a planarization layer disposed on the thin film encapsulation layer, the plurality of barrier ribs, and the scattering layer, and having a refractive index higher than that of the plurality of barrier ribs.

14. The organic light emitting display device of claim 13, wherein the scattering layer has a thickness less than a thickness of each of the plurality of barrier ribs.

15. The organic light emitting display device of claim 13, wherein the scattering layer has a thickness in a range from about 1 micrometer to about 8 micrometers.

16. The organic light emitting display device of claim 13, wherein each of the plurality of barrier ribs has a closed loop shape which encloses one of the two adjacent ones of the plurality of first electrodes in a plan view.

17. The organic light emitting display device of claim 13, wherein the plurality of barrier ribs is linearly symmetric with respect to an imaginary straight line which passes through a center of the pixel defining layer between the two adjacent ones of the plurality of first electrodes and is perpendicular to the substrate.

18. The organic light emitting display device of claim 13, wherein the plurality of barrier ribs does not overlap the plurality of first electrodes.

19. The organic light emitting display device of claim 13, wherein each of the plurality of barrier ribs has an isosceles trapezoidal shape in a cross-sectional view.

20. The organic light emitting display device of claim 13, wherein at least a part of the plurality of barrier ribs each has a non-isosceles trapezoidal shape in a cross-sectional view.

* * * * *